(12) United States Patent
Takami et al.

(10) Patent No.: US 11,651,790 B2
(45) Date of Patent: May 16, 2023

(54) THIN FILM COMPRISING TITANIUM OXIDE, AND METHOD OF PRODUCING THIN FILM COMPRISING TITANIUM OXIDE

(71) Applicant: JX Nippon Mining & Metals Corporation, Tokyo (JP)

(72) Inventors: Hideo Takami, Ibaraki (JP); Masataka Yahagi, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 0 days.

(21) Appl. No.: 17/181,093

(22) Filed: Feb. 22, 2021

(65) Prior Publication Data

US 2021/0174831 A1 Jun. 10, 2021

Related U.S. Application Data

(60) Continuation of application No. 14/625,081, filed on Feb. 18, 2015, which is a division of application No. 12/808,469, filed as application No. PCT/JP2008/072295 on Dec. 9, 2008, now abandoned.

(30) Foreign Application Priority Data

Dec. 18, 2007 (JP) ................................. 2007-326485
Sep. 18, 2008 (JP) ................................. 2008-239951

(51) Int. Cl.
| | | |
|---|---|---|
| H01J 37/34 | (2006.01) | |
| G11B 7/2548 | (2013.01) | |
| C04B 35/46 | (2006.01) | |
| C23C 14/08 | (2006.01) | |
| G11B 7/26 | (2006.01) | |
| C23C 14/34 | (2006.01) | |
| C04B 35/645 | (2006.01) | |
| G11B 7/2578 | (2013.01) | |
| G11B 7/254 | (2013.01) | |

(52) U.S. Cl.
CPC ............ *G11B 7/2548* (2013.01); *C04B 35/46* (2013.01); *C04B 35/645* (2013.01); *C23C 14/083* (2013.01); *C23C 14/34* (2013.01); *C23C 14/3414* (2013.01); *G11B 7/266* (2013.01); *H01J 37/3429* (2013.01); *B22F 2998/00* (2013.01); *C04B 2235/408* (2013.01); *C04B 2235/5436* (2013.01); *C04B 2235/77* (2013.01); *C04B 2235/79* (2013.01); *C04B 2235/9646* (2013.01); *G11B 7/2578* (2013.01); *G11B 2007/25408* (2013.01)

(58) Field of Classification Search
CPC ...... C04B 2235/408; C04B 2235/5436; C04B 2235/77; C04B 2235/79; C04B 2235/9646; C04B 35/46; C04B 35/645; B22F 2998/00; H01J 37/3429; C23C 14/083; C23C 14/34; C23C 14/3414
USPC ........................................ 204/298.12, 298.13
See application file for complete search history.

(56) References Cited

U.S. PATENT DOCUMENTS

| | | |
|---|---|---|
| 6,176,986 B1 | 1/2001 | Watanabe et al. |
| 6,528,442 B1 | 3/2003 | Kuwano et al. |
| 6,755,948 B1 | 6/2004 | Fukuyo et al. |
| 8,501,052 B2 | 8/2013 | Takami et al. |
| 8,758,497 B2 | 6/2014 | Takami et al. |
| 2003/0038028 A1 | 2/2003 | Schultheis et al. |
| 2003/0052000 A1 | 3/2003 | Segal et al. |
| 2005/0207331 A1 | 9/2005 | Shinkai et al. |
| 2007/0240981 A1* | 10/2007 | Schlott ............... C23C 14/3414 420/505 |
| 2008/0087866 A1 | 4/2008 | Wu et al. |
| 2011/0278511 A1 | 11/2011 | Takami et al. |
| 2012/0192763 A1 | 8/2012 | Takami et al. |
| 2012/0196076 A1 | 8/2012 | Takami et al. |
| 2014/0023868 A1 | 1/2014 | Takami et al. |

FOREIGN PATENT DOCUMENTS

| | | |
|---|---|---|
| CN | 1557990 A | 12/2004 |
| CN | 1800067 A | 7/2006 |
| JP | H07-233469 A | 9/1995 |
| JP | H11-104500 A | 4/1999 |
| JP | 2000-030297 A | 1/2000 |

(Continued)

OTHER PUBLICATIONS

Jong-Won Yoon et al., "Preparation and Characterization of M/TiO2 (M=Ag, Au, Pt) Nanocomposite Thin Films", Scripta Materialia, vol. 44, Issues 8-9, pp. 1865-1868, Apr. 18, 2001.

(Continued)

*Primary Examiner* — Rodney G McDonald
(74) *Attorney, Agent, or Firm* — Howson & Howson LLP

(57) ABSTRACT

A thin film is provided that primarily comprises titanium oxide and includes Ti, Ag and O. The thin film contains 29.6 at % or more and 34.0 at % or less of Ti, 0.003 at % or more and 7.4 at % or less of Ag, and oxygen as the remainder thereof and has a ratio of oxygen to metals, O/(2Ti+0.5Ag), of 0.97 or more. The thin film has a high refractive index and a low extinction coefficient. In addition, the thin film has superior transmittance, minimally deteriorates in reflectance, and is useful as an interference film or a protective film for an optical information recording medium. The film may also be applied to a glass substrate to provide a heat reflective film, an antireflective film, or an interference filter. A method of producing the thin film is also disclosed.

6 Claims, No Drawings

(56) References Cited

FOREIGN PATENT DOCUMENTS

| JP | 2006-079710 A | | 3/2006 |
|----|---------------|---|--------|
| JP | 2006-107579 A | | 4/2006 |
| JP | 2006-144052 A | | 6/2006 |
| JP | 2006-252706 A | | 9/2006 |
| WO | WO 2007/042394 | * | 4/2007 |

OTHER PUBLICATIONS

Seung Wan Ryu et al., "Effect of Calcination on the Structural and Optical Properties of M/TiO2 Thin Films by RF Magnetron Co-Sputtering", Materials Letters, vol. 58, Issue 5, pp. 582-587, Feb. 2004.

Anass Dakka et al., "Optical Properties of Ag—TiO2 Nanocermet Films Prepared by Cosputtering and Multilayer Deposition Techniques", Applied Optics, Optical Society of America, vol. 39, No. 16, pp. 2745-2753, Jun. 1, 2000.

Nobuo Akahira, "High Density Recording Technologies on Optical Disks", Technical Journal "Kogaku", vol. 26, Issue 1, pp. 9-15, Jan. 26, 1997.

Gaoling Zhao et al., "Sol-gel Preparation and Photoelectrochemcial Properties of TiO2 Films Containing Au and Ag metal Particles", Elsevier Science S.A., Thin Solid Films, vol. 277, No. 1/2, pp. 147-154, May 1996.

Hiromitsu Kozuka et al., "Preparation of Ag/TiO2 Composite Films by the Sol-Gel Method", Bull. Inst. Chem. Res., Kyoto Univ., vol. 72, No. 2, pp. 209-224, Oct. 1994.

Feng Zhang et al., "Surface Properties of Silver Doped Titanium Oxide Films", Surface and Coatings Technology, vol. 148, Issue No. 1, pp. 65-70, Nov. 2001.

* cited by examiner

THIN FILM COMPRISING TITANIUM OXIDE, AND METHOD OF PRODUCING THIN FILM COMPRISING TITANIUM OXIDE

CROSS REFERENCE TO RELATED APPLICATIONS

This application is a continuation of co-pending U.S. application Ser. No. 14/625,081, filed Feb. 18, 2015, which is a divisional of U.S. application Ser. No. 12/808,469 which is the National Stage of International Application No. PCT/JP2008/072295, filed Dec. 9, 2008, which claims the benefit under 35 USC 119 of Japanese Application No. 2007-326485, filed Dec. 18, 2007, and Japanese Application No. 2008-239951, filed Sep. 18, 2008.

BACKGROUND

The present invention relates to a thin film mainly comprising titanium oxide having a high refractive index and a low extinction coefficient, a sintered sputtering target mainly comprising titanium oxide suitable for producing the thin film, and a method of producing a thin film mainly comprising titanium oxide.

In recent years, technology of high-density optical recording disks such as high-density optical information recording media capable of rewriting without requiring a magnetic head has been developed, and these disks are rapidly being commercialized. In particular, CD-RW appeared for the first time in 1977 as a rewritable CD, and is the most popular phase-change optical disk today. This CD-RW has a rewrite cycle of approximately 1000 times. Further, DVD-RW for use as a DVD has been developed and commercialized, and the layer structure of this disk is identical with or similar to the structure of CD-RW. This DVD-RW has a rewrite cycle of approximately 1000 to 10000 times. These disks record, replay and rewrite information by irradiating an optical beam to cause an optical change of the recording material such as its transmittance or reflectance, and are electronic parts that have spread rapidly.

Generally speaking, a phase-change optical disc used as a CD-RW or a DVD-RW has a four-layer structure wherein both sides of a recording thin film layer of Ag—In—Sb—Te system or Ge—Sb—Te system or the like are sandwiched between the protective layers of high-melting dielectrics such as ZnS•SiO$_2$ or the like, and a silver or silver alloy or aluminum alloy reflective film is additionally provided thereto. Further, in order to increase the rewrite cycle, an interface layer is provided between a memory layer and a protective layer as necessary. The reflective layer and the protective layer are demanded to have an optical function capable of increasing the reflectance difference between the amorphous portion and the crystal portion of the recording layer, and also demanded to have a function of protecting the recording thin film from moisture and heat deformation as well as a function for controlling the thermal conditions upon recording (see "Kogaku" magazine, volume 26, no. 1, pages 9 to 15).

In recent years, in order to enable high-capacity and high-density storage, an optical recording medium of single-sided double (dual) layer has been proposed (see Publication of Unexamined Japanese Application No. 2006-79710). Japanese Application Publication No. 2006-79710 has a first information layer formed on a substrate 1 and a second information layer formed on a substrate 2 from the incident direction of the laser beam, and these information films are laminated so as to face each other via an interlayer. In the foregoing case, the first information layer is configured from a recording layer and a first metal reflective layer, and the second information layer is configured from a first protective layer, a second protective layer, a recording layer and a second metal reflective layer. In addition, a hard coating layer for protecting the disk from scratches and contamination or the like, a thermal diffusion layer, and other layers may also be arbitrarily formed. In addition, various types of materials have been proposed for the foregoing protective layer, recording layer, reflective layer, and other layers.

The protective layer of high-melting dielectrics must be durable against repeated thermal stress caused by the heating and cooling and must not allow such thermal effect to influence the reflective film or other areas, and it is also required to be thin and have low reflectivity and strength to prevent alteration. From this perspective, the dielectric protective layer plays an important role. In addition, needless to say, the recording layer, the reflective layer, the interference film layer and the like are also important from the perspective of enabling the electronic parts such as CDs and DVDs to fulfill their functions respectively.

The respective thin films of a multilayer structure are usually formed with the sputtering method. This sputtering method is to make a positive electrode substrate and a negative electrode target face each other, and generates an electric field by applying a high voltage between the substrate and the target under an inert gas atmosphere. The sputtering method employs a principle where plasma is formed by the collision of ionized electrons and the inert gas at the stage of generating an electric field, the positive ions in this plasma collide with the target (negative electrode) surface to knock out the constituent atoms of the target, and the extruded atoms adhere to the opposing substrate surface to form a film.

Under the foregoing circumstances, a target using titanium oxide (TiO$_x$) is being proposed as a sputtering target for forming a heat reflective film and an antireflective film (see Japanese Patent No. 3836163). In the foregoing case, Japanese Patent No. 3836163 describes that the specific resistance value is set at 0.35 Ωcm or less in order to stabilize the discharge during the sputtering, and DC sputtering becomes possible, whereby a film of high refractive index can be obtained. Nevertheless, since the film transmittance will deteriorate, measures of setting the oxygen content to be 35 wt % or more and additionally introducing oxygen are being adopted. Moreover, since the deposition rate will deteriorate due to the introduction of oxygen, metal oxide is added in order to improve the deposition rate. However, there are problems in its application as precision optics or electronic parts requiring films having a high refractive index and low absorption. In particular, it is considered that there are problems on the short wavelength side in the vicinity of 400 nm.

SUMMARY

In light of the foregoing problems, it is an object of this invention to provide a thin film mainly comprising titanium oxide having a high refractive index and a low extinction coefficient, a sintered sputtering target mainly comprising titanium oxide suitable for producing the thin film, and a method of producing a thin film mainly comprising titanium oxide. Another object of this invention is to obtain a thin film that has superior transmittance, minimally deteriorates in reflectance, and is useful as an interference film or a protective film for an optical information recording medium. It is also possible to apply this thin film to a glass substrate; that is, which can be used as a heat reflective film, an antireflective film, and an interference filter.

In order to achieve the foregoing objects, as a result of intense study, the present inventors discovered that it is extremely effective to add silver or silver oxide to titanium oxide in order to obtain a material that maintains transmittance and prevents the deterioration in reflectance without losing its properties as an interference film or a protective film for an optical information recording medium.

Based on the foregoing discovery, the present invention provides a thin film mainly comprising titanium oxide, wherein the thin film comprises components of Ti, Ag and O and contains 29.6 at % or more and 34.0 at % or less of Ti, 0.003 at % or more and 7.4 at % or less of Ag, and oxygen as the remainder thereof, and O/(2Ti+0.5Ag) as a ratio of oxygen to metals is 0.97 or more. The thin film mainly comprising titanium oxide may have an O/Ti ratio of oxygen to Ti of 2 or more and may have a refractive index in a wavelength region from 400 to 410 nm of 2.60 or more. The thin film mainly comprising titanium oxide may have an extinction coefficient in a wavelength region from 400 to 410 nm of 0.1 or less, or 0.03 or less. The thin film may be used as an interference film, a protective film, or an optical recording medium.

In addition, the present invention may provide a sintered sputtering target suitable for producing a thin film mainly comprising titanium oxide, wherein the target comprises components of Ti, Ag and O, contains the respective components at a composition ratio of $(TiO_{2-m})_{1-n}Ag_n$ (where: $0 \le m \le 0.5$, and $0.0001 \le n \le 0.2$), and has a specific resistance of 10 Ωcm or less. Alternatively, "n" may be provided as: $0.01 \le n \le 0.2$. The sintered sputtering target may have an average grain size of Ag phase existing in the sintered sputtering target of 15 μm or less.

A method of producing a thin film mainly comprising titanium oxide may include using a sintered sputtering target, which comprises components of Ti, Ag and O, contains the respective components at a composition ratio of $(TiO_{2-m})_{1-n}Ag_n$ (provided $0 \le m \le 0.5$, and $0.0001 \le n \le 0.2$), and has a specific resistance of 10 Ωcm or less, to perform sputtering under an argon gas atmosphere without oxygen or with 0.1 to 16% of oxygen, whereby formed on a substrate is a thin film which contains 29.6 at % or more and 34.0 at % or less of Ti, 0.003 at % or more and 7.4 at % or less of Ag, and oxygen as the remainder thereof, and in which O/(2Ti+0.5Ag) as a ratio of oxygen to metals is 0.97 or more. The method, when deposition is performed by way of DC sputtering and an oxygen gas ratio in the sputtering atmosphere is represented in b (%), may be performed with an oxygen gas ratio adjusted to be in a range of $0 < b \le 83.3n-0.17$ when the composition ration of Ag in the sputtering target is $0.0001 \le n \le 0.01$, and an oxygen gas ratio adjusted to be in a range of $17n-0.17 \le b \le 83.3n-0.17$ when the composition ratio n of Ag is $0.01 \le n \le 0.2$. The method of producing a thin film mainly comprising titanium oxide may include sputtering in which the oxygen gas ratio b is equal to 0% when the composition ratio m is in a range of $0 \le m \le 0.05$ and the composition ratio n of Ag is $0.0001 \le n \le 0.01$.

As described above, the present invention provides a thin film mainly comprising titanium oxide having a high refractive index and a low extinction coefficient, a sintered sputtering target mainly comprising titanium oxide suitable for producing the thin film, and a method of producing a thin film mainly comprising titanium oxide. The thin film obtained by the present invention yields a great effect as films and layers for an optical information recording medium. In addition, the thin film of the present invention has superior transmittance, minimally deteriorates in reflectance, and is particularly useful as an interference film or a protective film for an optical information recording medium. The protective layer of high-melting dielectrics must be durable against repeated thermal stress caused by the heating and cooling, and must not allow such thermal effect to influence the reflective film or other areas, and it is also required to be thin and have low reflectivity and strength to prevent alteration. The thin film mainly comprising titanium oxide of the present invention has properties that can be applied to such a material. In addition, since the oxygen content during sputtering can be adjusted to be within a low range, the present invention also yields an effect of being able to inhibit deterioration of deposition rate.

DETAILED DESCRIPTION

The thin film mainly comprising titanium oxide of the present invention comprises, as described above, components of Ti, Ag and O, contains 29.6 at % or more and 34.0 at % or less of Ti, 0.003 at % or more and 7.4 at % or less of Ag, and oxygen as the remainder thereof, and has a composition ratio in which O/(2Ti+0.5Ag) as a ratio of oxygen to metals is 0.97 or more. The existence of Ag yields an effect of increasing the refractive index of the thin film. If the amount of Ag is less than 0.003, the effect of adding Ag is small, and if the amount of Ag exceeds 7.4, the extinction coefficient of the thin film in a wavelength region from 400 to 410 nm tends to increase. Thus, it is preferable that the abundance of Ag in the thin film is 0.03 at % or more and 7.4 at % or less.

Although the reason why the refractive index increases is not necessarily clear, it is considered to be because silver (Ag) is dispersed as fine particles (nanoparticles and the like) in the amorphous film of titanium oxide. In certain cases, silver may partially exist as silver oxide ($Ag_2O$, $Ag_2O_2$ or the like), but such partial existence as silver oxide does not cause any particular problem, and the improvement in the refractive index is similarly acknowledged. The existence of silver oxide can be confirmed when the peak position of $Ag_3d$ is 368.0 eV or less in the XPS analysis. The material having a high refractive index obtained as described above will become a more favorable material since the possibility of optical multilayer film design can be expanded.

The foregoing thin film is an amorphous film, and it is possible to obtain a film in which a refractive index in a wavelength region from 400 to 410 nm is 2.60 or more. It is further possible to obtain a thin film in which an extinction coefficient in a wavelength region from 400 to 410 nm is 0.1 or less, and even 0.03 or less. The foregoing wavelength region from 400 to 410 nm is the wavelength region of a blue laser. As described above, the refractive index is 2.60 or more in the foregoing wavelength region, and higher the refractive index, the more favorable it is. Moreover, an extinction coefficient of 0.1 or less, and even 0.03 or less can be achieved, and lower the extinction coefficient, the more suitable it is for multilayering. This thin film mainly comprising titanium oxide is effective as an interference film or a protective film, and particularly useful as an optical recording medium.

The foregoing thin film can be produced by using a sintered sputtering target having a composition ratio of $(TiO_{2-m})_{1-n}Ag_n$ (provided $0 \le m \le 0.5$, and $0.0001 \le n \le 0.2$), and a specific resistance of 10 Ωcm or less. When sputtering is performed in the foregoing case, deposition is preferably performed in an oxygen-containing atmosphere if the Ag content is particularly high. Thus, the oxygen in the sputtered film will increase. In particular, it is possible to obtain a thin film mainly comprising titanium oxide having a low extinction coefficient in a wavelength region from 400 to 410 nm by adjusting O/Ti as the ratio of oxygen to Ti to be 2 or more. The sintered target of the present invention has a similar component composition as the thin film, but is not the same. Specifically, whereas the basic components of the target include Ti, Ag and O, the composition ratio of the respective components is $(TiO_{2-m})_{1-n}Ag_n$ (provided $0 \leq m \leq 0.5$, and $0.0001 \leq n \leq 0.2$). In addition, the target has a specific resistance of 10 Ωcm or less.

In the foregoing case, if m exceeds 0.5, the extinction coefficient tends to increase since the oxygen defect becomes too large, and therefore, m is preferably set to 0.5 or less. In addition, if n is less than 0.0001, the effect of adding Ag is small, and if n exceeds 0.2, the extinction coefficient in the case of performing the foregoing deposition tends to increase. Thus, n is preferably set to 0.0001 or more and 0.2 or less. Conductivity of the target is required for increasing the sputtering efficiency, and the target of the present invention has such a condition and can be subject to DC sputtering.

Incidentally, as described later, if the composition ratio m is in the range of $0 \leq m \leq 0.05$ and the composition ration of Ag is $0.0001 \leq n \leq 0.01$, the deposition rate can be considerably adjusted based on the sputtering conditions; that is, based on whether the sputtering atmosphere is to be Ar+O2 gas or only Ar gas. If the composition ratio is $0.05 \leq m \leq 0.5$ or $0.01 \leq n \leq 0.2$, since the extinction coefficient will increase when the sputtering atmosphere is only Ar gas, it is desirable to use Ar+O2 gas. In the foregoing case, the target composition will be changed according to the purpose of production.

In addition, if the average grain size of the Ag phase existing in the sintered sputtering target is 15 μm or less, DC sputtering can be performed even more easily. Meanwhile, if the average grain size of the Ag phase exceeds 15 μm, abnormal discharge will occur frequently. Thus, the average grain size of the Ag phase is preferably 15 μm or less. This sintered sputtering target is used to perform sputtering under an argon gas atmosphere without oxygen or with 0.1 to 16% of oxygen, whereby a titanium oxide thin film containing Ag and/or Ag oxide can be formed on a substrate.

Upon producing the thin film, as described above, a sintered sputtering target, which comprises Ti, Ag and O, contains the respective components at a composition ratio of $(TiO_{2-m})_{1-n}Ag_n$ (provided $0 \leq m \leq 0.5$, and $0.0001 \leq n \leq 0.2$), and has a specific resistance of 10 Ωcm or less, is used to perform sputtering under an argon gas atmosphere without oxygen or with 0.1 to 16% of oxygen. Specifically, it is thereby possible to form, on a substrate, a thin film which comprises 29.6 at % or more and 34.0 at % or less of Ti, 0.003 at % or more and 7.4 at % or less of Ag, and oxygen as the remainder thereof, and in which O/(2Ti+0.5Ag) as a ratio of oxygen to metals is 0.97 or more.

In the foregoing case, the preferred conditions in producing the thin film mainly comprising titanium oxide of the present invention are that, if deposition is performed by way of DC sputtering and an oxygen gas ratio in the sputtering atmosphere is represented in b (%), the oxygen gas ratio is adjusted to be in a range of $0 < b \leq 83.3n - 0.17$ when the composition ration of Ag in the sputtering target is $0.0001 \leq n \leq 0.01$, and the oxygen gas ratio is adjusted to be in a range of $17n - 0.17 \leq b \leq 83.3n - 0.17$ when the composition ratio n of Ag is $0.01 \leq n \leq 0.2$. Nevertheless, as described above, if the composition ratio m is in the range of $0 \leq m \leq 0.05$ and the composition ratio n of Ag is $0.0001 \leq n \leq 0.01$, sputtering can also be performed by adjusting the oxygen gas ratio b to be b=0%. Specifically, it is possible to perform sputtering capable of satisfying the optical properties even without any oxygen leakage, and an effect is yielded in that the deposition rate can be considerably improved.

In order to produce the target, as the raw materials, high-purity (normally, 4N or higher) titanium oxide ($TiO_2$) having an average grain size of 10 μm or less and high-purity (normally, 3N or higher) silver powder having an average grain size of 20 μm or less are used. These are blended to achieve the composition ratio of the present invention. Subsequently, after blending the foregoing raw materials, they are mixed with a wet ball mill or a dry blender (mixer) so that the silver will be uniformly dispersed in the titanium oxide powder. After the mixing, the mixed powder is filled in a carbon die and subject to hot press. The hot press conditions may be changed according to the amount of the sintering material, but hot press is usually performed within the range of 800 to 1000° C. and bearing surface pressure of 100 to 500 kgf/cm$^2$. Nevertheless, these conditions are merely representative conditions and can be selected arbitrarily, and there is no particular limitation of such conditions. After the sintering, the sintered compact is machined into a target shape. Consequently, it is possible to obtain a target in which the basic components thereof are Ti, Ag and O, the respective components are contained at a composition ratio of $(TiO_{2-m})_{1-n}Ag_n$ (provided $0 \leq m \leq 0.5$, and $0.0001 \leq n \leq 0.2$), and silver (Ag) and/or silver oxide ($Ag_2O$, $Ag_2O_2$ or the like) is dispersed as fine particles in the matrix of titanium oxide.

EXAMPLES

The present invention is now explained in detail with reference to the Examples and Comparative Examples. Incidentally, these Examples are merely illustrative, and the present invention shall in no way be limited thereby. In other words, the present invention shall only be limited by the scope of claim for a patent, and shall include the various modifications other than the Examples of this invention.

Example 1

As the raw materials, titanium oxide ($TiO_2$) having an average grain size of 10 μm and a purity of 4N (99.99%) and silver powder having an average grain size of 15 μm and a purity of 3N (99.9%) were used. These raw materials were blended to achieve $TiO_2$:Ag=99:1 (at %) and mixed. 1 kg of the mixed powder was mixed with a wet ball mill so that the silver is uniformly dispersed in the titanium oxide powder. Subsequently, the mixed powder that was dried until moisture evaporated was filled in a carbon die and subject to hot press. The hot press conditions were 900° C. and bearing surface pressure of 300 kgf/cm$^2$. The obtained sintered compact was machined to prepare a target of diameter (φ) 152 mm and 5 mm thickness (t). Consequently, a target having a density of 96% and a specific resistance of 7 Ωcm was obtained. The grain size of the Ag phase in the target was 15 μm. No abnormal discharge occurred during the sputtering. The results are shown in Table 1.

TABLE 1

| | Target Composition (at %) | Specific Resistance (Ωcm) | Sputtering Atmosphere | Grain Size of Ag Phase (μm) | Abnormal Discharge during DC Sputtering |
|---|---|---|---|---|---|
| Example 1 | $TiO_2$:Ag = 99:1 | 7 | Ar-0.5% $O_2$ | 15 | None |
| Example 2 | $TiO_2$:Ag = 90:10 | 2 | Ar-2% $O_2$ | 10 | None |
| Comparative Example 1 | $TiO_2$:Ag = 90:10 | 2 | Ar | 10 | None |
| Comparative Example 2 | $TiO_2$ = 100% | >100 | Ar-2% $O_2$ | — | Occurred |
| Example 3 | $TiO_2$:Ag = 99.9:0.1 | 10 | Ar | 10 | None |
| Example 4 | $TiO_2$:Ag = 98:2 | 6 | Ar-1% $O_2$ | 15 | None |
| Comparative Example 3 | $TiO_2$:Ag = 60:40 | 0.0003 | Ar-10% $O_2$ | 20 | None |
| Example 5 | $TiO_2$:Ag = 90:10 | 0.5 | Ar-2% $O_2$ | 5 | None |
| Example 6 | $TiO_2$:Ag = 90:10 | 0.6 | Ar-2% $O_2$ | 1 | None |
| Comparative Example 4 | $TiO_2$:Ag = 90:10 | 15 | Ar-2% $O_2$ | 50 | Occurred |
| Comparative Example 5 | $TiO_2$:Ag = 90:10 | 2 | Ar-20% $O_2$ | 10 | None |
| Example 7 | $TiO_2$:Ag = 99:1 | 7 | Ar | 15 | None |
| Example 8 | $TiO_2$:Ag = 99.5:0.5 | 9 | Ar | 10 | None |
| Example 9 | $TiO_2$:Ag = 99.95:0.05 | 10 | Ar | 1.5 | None |
| Example 10 | $TiO_2$:Ag = 99.99:0.01 | 10 | Ar | 1.5 | None |
| Example 11 | $TiO_{1.9}$:Ag = 99.95:0.05 | 0.01 | Ar-4% $O_2$ | 1.5 | None |
| Example 12 | $TiO_{1.5}$:Ag = 99.99:0.01 | 0.008 | Ar-4% $O_2$ | 1.5 | None |
| Example 13 | $TiO_{1.95}$:Ag = 99.9:0.1 | 0.08 | Ar | 5 | None |
| Comparative Example 6 | $TiO_{1.9}$:Ag = 99.95:0.05 | 0.01 | Ar | 1.5 | None |
| Comparative Example 7 | $TiO_{1.5}$:Ag = 99.99:0.01 | 0.008 | Ar | 1.5 | None |

Subsequently, the sputtering target produced as described above was used to form a sputtered film on a glass substrate. As the sputtering conditions, DC sputtering was performed in an Ar gas-0.5% 02 gas atmosphere with a gas pressure of 0.5 Pa, a gas flow rate of 50 sccm, and a sputtering power of 500 to 1000 w. It was possible to perform DC sputtering without any problem, and it was confirmed that the target has conductivity. A sputtered film of 500 Å was formed on the glass substrate. The film composition analyzed with EPMA was Ti: 32.9 at %, Ag: 0.7 at %, O: 66.4 at %, O/Ti: 2.02, and O/(2Ti+0.5Ag): 1.00. The refractive index and extinction coefficient of the sputtered film were measured. The refractive index and extinction coefficient were measured with an ellipsometer using a light wavelength of 405 nm. These results are also shown in Table 2. Incidentally, the oxygen level in Table 2 is the balance. Consequently, the refractive index increased to 2.63, and the extinction coefficient considerably decreased to 0.005. Thus, it was possible to form a favorable interference film or protective film for an optical recording medium.

TABLE 2

| | Film Composition | | | | | Deposition Rate (Å/sec/kW) | Refractive Index | Extinction Coefficient |
|---|---|---|---|---|---|---|---|---|
| | Ti (at %) | Ag (at %) | O (at %) | O/Ti | O (2Ti + 0.5Ag) | | | |
| Example 1 | 32.9 | 0.7 | 66.4 | 2.02 | 1.00 | 1.4 | 2.63 | 0.005 |
| Example 2 | 31.2 | 3.5 | 65.3 | 2.09 | 1.02 | 1.1 | 2.73 | 0.008 |
| Comparative Example 1 | 32.3 | 3.7 | 64 | 1.98 | 0.96 | 1.9 | 2.65 | 0.23 |
| Comparative Example 2 | 33.2 | 0 | 66.8 | 2.01 | 1.01 | 0.9 | 2.59 | 0.004 |
| Example 3 | 33.3 | 0.04 | 66.66 | 2.00 | 1.00 | 1.7 | 2.63 | 0.01 |
| Example 4 | 32.3 | 1.4 | 66.4 | 2.06 | 1.02 | 1.4 | 2.67 | 0.006 |
| Comparative Example 3 | 26.3 | 17.5 | 56.2 | 2.14 | 0.92 | 0.8 | 2.5 | 0.15 |
| Example 5 | 31.0 | 3.6 | 65.4 | 2.11 | 1.03 | 1.1 | 2.72 | 0.008 |
| Example 6 | 31.4 | 3.5 | 65.1 | 2.07 | 1.01 | 1.1 | 2.74 | 0.007 |
| Comparative Example 4 | — | — | — | — | — | 1.1 | — | — |
| Comparative Example 5 | 30.7 | 3.1 | 66.2 | 2.16 | 1.05 | 0.3 | 2.59 | 0.005 |
| Example 7 | 33.1 | 0.7 | 66.2 | 2.00 | 0.99 | 1.8 | 2.67 | 0.02 |
| Example 8 | 33.3 | 0.2 | 66.5 | 2.00 | 1.00 | 1.8 | 2.66 | 0.01 |
| Example 9 | 33.3 | 0.02 | 66.68 | 2.00 | 1.00 | 1.6 | 2.62 | 0.007 |
| Example 10 | 33.3 | 0.005 | 66.695 | 2.00 | 1.00 | 1.6 | 2.61 | 0.005 |
| Example 11 | 33.4 | 0.02 | 66.58 | 1.99 | 1.00 | 0.7 | 2.61 | 0.007 |

TABLE 2-continued

|  | Film Composition | | | | | Deposition Rate (Å/sec/kW) | Refractive Index | Extinction Coefficient |
|---|---|---|---|---|---|---|---|---|
|  | Ti (at %) | Ag (at %) | O (at %) | O/Ti | O (2Ti + 0.5Ag) | | | |
| Example 12 | 33.4 | 0.006 | 66.594 | 1.99 | 1.00 | 0.6 | 2.60 | 0.01 |
| Example 13 | 33.8 | 0.04 | 66.16 | 1.96 | 0.98 | 1.6 | 2.63 | 0.09 |
| Comparative Example 6 | 34.3 | 0.02 | 65.68 | 1.91 | 0.96 | 1.6 | 2.58 | 0.21 |
| Comparative Example 7 | 39.9 | 0.006 | 60.094 | 1.51 | 0.75 | 1.5 | 2.54 | 0.34 |

Example 2

As the raw materials, titanium oxide ($TiO_2$) having an average grain size of 10 μm and a purity of 4N (99.99%) and silver powder having an average grain size of 10 μm and a purity of 3N (99.9%) were used. These raw materials were blended to achieve $TiO_2$:Ag=90:10 (at %) and mixed. 1 kg of the mixed powder was mixed with a dry blender so that the silver is uniformly dispersed in the titanium oxide powder. Subsequently, the mixed powder was filled in a carbon die and subject to hot press. The hot press conditions were 920° C. and bearing surface pressure of 350 kgf/cm². The obtained sintered compact was machined to prepare a target of φ152 mm and 5 mmt. Consequently, a target having a density of 96% and a specific resistance of 2 Ωcm was obtained. The grain size of the Ag phase in the target was 10 μm. No abnormal discharge occurred during the sputtering. The results are also shown in Table 1.

Subsequently, the sputtering target produced as described above was used to form a sputtered film on a glass substrate. As the sputtering conditions, DC sputtering was performed in an Ar gas-2% O2 gas atmosphere with a gas pressure of 0.5 Pa, a gas flow rate of 50 sccm, and a sputtering power of 500 to 1000 w. It was possible to perform DC sputtering without any problem, and it was confirmed that the target has conductivity. A sputtered film of 500 Å was formed on the glass substrate. The film composition was Ti: 31.2 at %, Ag: 3.5 at %, O: 65.3 at %, O/Ti: 2.09, and O/(2Ti+0.5Ag): 1.02. The refractive index and extinction coefficient of the sputtered film were measured. The refractive index and extinction coefficient were measured with an ellipsometer using a light wavelength of 405 nm. These results are also shown in Table 2. Consequently, the refractive index increased to 2.73, and the extinction coefficient considerably decreased to 0.008. Thus, it was possible to form a favorable interference film or protective film for an optical recording medium.

Comparative Example 1

In this Comparative Example, the target obtained in Example 2 was subject to sputtering in an oxygen-free Ar atmosphere. Although it was possible to perform DC sputtering itself, problems arose in the properties of the thin film. Specifically, the refractive index of the obtained film decreased to 2.65, and the extinction coefficient increased to 0.23. Accordingly, even if the target itself is free from problems, when it is subject to sputtering in an oxygen-free Ar atmosphere, it is not possible to obtain a favorable thin film. As for Comparative Example 1, the results of the target are shown in Table 1, and the composition and results of the thin film are shown in Table 2. As shown in the Tables, the film composition was Ti: 32.3 at %, Ag: 3.7 at %, O: 64 at %, O/Ti: 1.98, and O/(2Ti+0.5Ag): 0.96.

Moreover, although several other tests were conducted, it was discovered that, in cases where the Ag content exceeds 1.5%, problems arise from decrease in the refractive index and increase in the extinction coefficient if sputtering is not performed in an argon gas atmosphere containing 0.1 to 16% of oxygen. Accordingly, when using the sintered sputtering target of the present invention, particularly when the Ag content is 1.5% or more, it is preferable to perform sputtering in an argon gas atmosphere containing 0.1 to 16% of oxygen.

Comparative Example 2

As the raw material, titanium oxide ($TiO_2$) having an average grain size of 10 μm and a purity of 4N (99.99%) was used. Specifically, in Comparative Example 2, only $TiO_2$: 100 (at %) was used without adding silver powder. 1 kg of this powder was filled in a carbon die and subject to hot press. The hot press conditions were 950° C. and bearing surface pressure of 250 kgf/cm². The obtained sintered compact was machined to prepare a target of φ152 mm and 5 mmt. Consequently, the density increased to 97%. Nevertheless, the obtained target had a specific resistance exceeding 100 Ωcm. The results are also shown in Table 1.

Subsequently, the sputtering target produced as described above was used to form a sputtered film on a glass substrate. As the sputtering conditions, DC sputtering was performed in an Ar gas-2% O2 gas atmosphere with a gas pressure of 0.5 Pa, a gas flow rate of 50 sccm, and a sputtering power of 500 to 1000 w. Nevertheless, since abnormal discharge occurred during the DC sputtering and caused an unstable state, DC sputtering was discontinued and deposition was performed once again by way of RF sputtering. The film composition was Ti: 33.2 at %, Ag: 0 at %, O: 66.8 at %, O/Ti: 2.01, and O/(2Ti+0.5Ag): 1.01. A sputtered film of 500 Å was formed on the glass substrate. The refractive index and extinction coefficient of the sputtered film were measured. The refractive index and extinction coefficient were measured with an ellipsometer using a light wavelength of 405 nm. These results are also shown in Table 2. Consequently, the refractive index decreased to 2.59, and the extinction coefficient was 0.004. Although there is no particular problem with the extinction coefficient, the refractive index decreased, abnormal discharge occasionally occurred, and there was a problem in that the stability of DC sputtering would deteriorate considerably.

Example 3

As the raw materials, titanium oxide ($TiO_2$) having an average grain size of 10 μm and a purity of 4N (99.99%) and silver powder having an average grain size of 10 μm and a purity of 3N (99.9%) were used. These raw materials were blended to achieve $TiO_2$:Ag=99.9:0.1 (at %) and mixed. 1 kg of the mixed powder was mixed with a dry blender so that the silver is uniformly dispersed in the titanium oxide powder. Subsequently, the mixed powder was filled in a carbon die and subject to hot press. The hot press conditions were 920° C. and bearing surface pressure of 350 kgf/cm². The obtained sintered compact was machined to prepare a target of φ152 mm and 5 mmt. Consequently, a target having a density of 98% and a specific resistance of 10 Ωcm was obtained. The grain size of the Ag phase in the target was 10 μm. No abnormal discharge occurred during the sputtering. The results are also shown in Table 1.

Subsequently, the sputtering target produced as described above was used to form a sputtered film on a glass substrate. As the sputtering conditions, DC sputtering was performed in an Ar gas atmosphere with a gas pressure of 0.5 Pa, a gas flow rate of 50 sccm, and a sputtering power of 500 to 1000 w. It was possible to perform DC sputtering without any problem, and it was confirmed that the target has conductivity. The deposition rate improved considerably to 1.7 Å/sec/kW. A sputtered film of 500 Å was formed on the glass substrate. The film composition was Ti: 33.3 at %, Ag: 0.04 at %, O: 66.66 at %, O/Ti: 2.00, and O/(2Ti+0.5Ag): 1.00. Incidentally, the Ag composition was analyzed with SIMS. The refractive index and extinction coefficient of the sputtered film were measured. The refractive index and extinction coefficient were measured with an ellipsometer using a light wavelength of 405 nm. These results are also shown in Table 2. Consequently, the refractive index increased to 2.63, and the extinction coefficient was 0.01. Thus, it was possible to form a favorable interference film or protective film for an optical recording medium.

Example 4

As the raw materials, titanium oxide (TiO₂) having an average grain size of 10 μm and a purity of 4N (99.99%) and silver powder having an average grain size of 15 μm and a purity of 3N (99.9%) were used. These raw materials were blended to achieve TiO₂:Ag=98:2 (at %) and mixed. 1 kg of the mixed powder was mixed with a dry blender so that the silver is uniformly dispersed in the titanium oxide powder. Subsequently, the mixed powder was filled in a carbon die and subject to hot press. The hot press conditions were 920° C. and bearing surface pressure of 350 kgf/cm². The obtained sintered compact was machined to prepare a target of φ152 mm and 5 mmt. Consequently, a target having a density of 96% and a specific resistance of 6 Ωcm was obtained. The grain size of the Ag phase in the target was 15 μm. No abnormal discharge occurred during the sputtering. The results are also shown in Table 1.

Subsequently, the sputtering target produced as described above was used to form a sputtered film on a glass substrate. As the sputtering conditions, DC sputtering was performed in an Ar gas-1% O2 gas atmosphere with a gas pressure of 0.5 Pa, a gas flow rate of 50 sccm, and a sputtering power of 500 to 1000 w. It was possible to perform DC sputtering without any problem, and it was confirmed that the target has conductivity. A sputtered film of 500 Å was formed on the glass substrate. The film composition was Ti: 32.2 at %, Ag: 1.4 at %, O: 66.4 at %, O/Ti: 2.06, and O/(2Ti+0.5Ag): 1.02. The refractive index and extinction coefficient of the sputtered film were measured. The refractive index and extinction coefficient were measured with an ellipsometer using a light wavelength of 405 nm. These results are also shown in Table 2. Consequently, the refractive index increased to 2.67, and the extinction coefficient considerably decreased to 0.006. Thus, it was possible to form a favorable interference film or protective film for an optical recording medium.

Comparative Example 3

As the raw materials, titanium oxide (TiO₂) having an average grain size of 10 μm and a purity of 4N (99.99%) and silver powder having an average grain size of 20 μm and a purity of 3N (99.9%) were used. These raw materials were blended to achieve TiO₂:Ag=60:40 (at %) and mixed. 1 kg of the mixed powder was filled in a carbon die and subject to hot press. The hot press conditions were 950° C. and bearing surface pressure of 250 kgf/cm². The obtained sintered compact was machined to prepare a target of φ152 mm and 5 mmt. Consequently, the density increased to 90%. Nevertheless, the obtained target had a specific resistance of 0.0003 Ωcm. The results are also shown in Table 1. The grain size of the Ag phase in the target was 20 μm.

Subsequently, the sputtering target produced as described above was used to form a sputtered film on a glass substrate. As the sputtering conditions, DC sputtering was performed in an Ar gas-10% O2 gas atmosphere with a gas pressure of 0.5 Pa, a gas flow rate of 50 sccm, and a sputtering power of 500 to 1000 w. The film composition was Ti: 26.3 at %, Ag: 17.5 at %, O: 56.2 at %, O/Ti: 2.14, and O/(2Ti+0.5Ag): 0.92. A sputtered film of 500 Å was formed on the glass substrate. The refractive index and extinction coefficient of the sputtered film were measured. The refractive index and extinction coefficient were measured with an ellipsometer using a light wavelength of 405 nm. These results are also shown in Table 2. Consequently, the refractive index was 2.5 and the extinction coefficient was 0.15. The extinction coefficient increased and the refractive index decreased. However, abnormal discharge did not occur. This is considered to be a result of the electrical stability of the target due to a high Ag content regardless of the grain size of Ag.

Example 5

As the raw materials, titanium oxide (TiO₂) having an average grain size of 10 μm and a purity of 4N (99.99%) and silver powder having an average grain size of 20 μm and a purity of 3N (99.9%) were used. These raw materials were blended to achieve TiO₂:Ag=90:10 (at %) and mixed. 1 kg of the mixed powder was mixed with a dry blender so that the silver is uniformly dispersed in the titanium oxide powder. Subsequently, the mixed powder was filled in a carbon die and subject to hot press. The hot press conditions were 920° C. and bearing surface pressure of 350 kgf/cm². The obtained sintered compact was machined to prepare a target of φ152 mm and 5 mmt. Consequently, a target having a density of 95% and a specific resistance of 0.5 Ωcm was obtained. The grain size of the Ag phase in the target was 5 μm. No abnormal discharge occurred during the sputtering. The results are also shown in Table 1.

Subsequently, the sputtering target produced as described above was used to form a sputtered film on a glass substrate. As the sputtering conditions, DC sputtering was performed in an Ar gas-2% O2 gas atmosphere with a gas pressure of 0.5 Pa, a gas flow rate of 50 sccm, and a sputtering power of 500 to 1000 w. It was possible to perform DC sputtering without any problem, and it was confirmed that the target has conductivity. A sputtered film of 500 Å was formed on the glass substrate. The film composition was Ti: 31.0 at %, Ag: 3.6 at %, O: 65.4 at %, O/Ti: 2.11, 0/(2Ti+0.5Ag): 1.03. The refractive index and extinction coefficient of the sputtered film were measured. The refractive index and extinction coefficient were measured with an ellipsometer using a light wavelength of 405 nm. These results are also shown in Table 2. Consequently, the refractive index increased to 2.72, and the extinction coefficient considerably decreased to 0.008. Thus, it was possible to form a favorable interference film or protective film for an optical recording medium.

Example 6

As the raw materials, titanium oxide ($TiO_2$) having an average grain size of 10 μm and a purity of 4N (99.99%) and silver powder having an average grain size of 1 μm and a purity of 3N (99.9%) were used. These raw materials were blended to achieve $TiO_2$:Ag=90:10 (at %) and mixed. 1 kg of the mixed powder was mixed with a dry blender so that the silver is uniformly dispersed in the titanium oxide powder. Subsequently, the mixed powder was filled in a carbon die and subject to hot press. The hot press conditions were 920° C. and bearing surface pressure of 350 kgf/cm². The obtained sintered compact was machined to prepare a target of φ152 mm and 5 mmt. Consequently, a target having a density of 91% and a specific resistance of 0.6 Ωcm was obtained. The grain size of the Ag phase in the target was 1 μm. No abnormal discharge occurred during the sputtering. The results are also shown in Table 1.

Subsequently, the sputtering target produced as described above was used to form a sputtered film on a glass substrate. As the sputtering conditions, DC sputtering was performed in an Ar gas-2% O2 gas atmosphere with a gas pressure of 0.5 Pa, a gas flow rate of 50 sccm, and a sputtering power of 500 to 1000 w. It was possible to perform DC sputtering without any problem, and it was confirmed that the target has conductivity. A sputtered film of 500 Å was formed on the glass substrate. The film composition was Ti: 31.4 at %, Ag: 3.5 at %, O: 65.1 at %, O/Ti: 2.07, and O/(2Ti+0.5Ag): 1.01. The refractive index and extinction coefficient of the sputtered film were measured. The refractive index and extinction coefficient were measured with an ellipsometer using a light wavelength of 405 nm. These results are also shown in Table 2. Consequently, the refractive index increased to 2.74, and the extinction coefficient considerably decreased to 0.007. Thus, it was possible to form a favorable interference film or protective film for an optical recording medium.

Comparative Example 4

As the raw materials, titanium oxide ($TiO_2$) having an average grain size of 10 μm and a purity of 4N (99.99%) and silver powder having an average grain size of 50 μm and a purity of 3N (99.9%) were used. These raw materials were blended to achieve $TiO_2$:Ag=90:10 (at %) and mixed. 1 kg of the mixed powder was mixed with a dry blender so that the silver is uniformly dispersed in the titanium oxide powder. Subsequently, the mixed powder was filled in a carbon die and subject to hot press. The hot press conditions were 920° C. and bearing surface pressure of 350 kgf/cm². The obtained sintered compact was machined to prepare a target of φ152 mm and 5 mmt. Consequently, the obtained target had a density of 97% and a specific resistance of 15 Ωcm. The grain size of the Ag phase in the target was 50 μm. Subsequently, although an attempt was made to use the sputtering target produced as described above to form a sputtered film on a glass substrate, abnormal discharge occurred frequently during the sputtering and deposition was difficult. Thus, the deposition was discontinued.

Comparative Example 5

As the raw materials, titanium oxide ($TiO_2$) having an average grain size of 10 μm and a purity of 4N (99.99%) and silver powder having an average grain size of 10 μm and a purity of 3N (99.9%) were used. These raw materials were blended to achieve $TiO_2$:Ag=90:10 (at %) and mixed. 1 kg of the mixed powder was mixed with a dry blender so that the silver is uniformly dispersed in the titanium oxide powder. Subsequently, the mixed powder was filled in a carbon die and subject to hot press. The hot press conditions were 920° C. and bearing surface pressure of 350 kgf/cm². The obtained sintered compact was machined to prepare a target of φ152 mm and 5 mmt. Consequently, the obtained target had a density of 96% and a specific resistance of 2 Ωcm. The grain size of the Ag phase in the target was 10 μm. The results are also shown in Table 1.

Subsequently, the sputtering target produced as described above was used to form a sputtered film on a glass substrate. As the sputtering conditions, DC sputtering was performed in an Ar gas-20% O2 gas atmosphere with a gas pressure of 0.5 Pa, a gas flow rate of 50 sccm, and a sputtering power of 500 to 1000 w. Although it was possible to perform DC sputtering without any problem, the deposition rate was extremely slow at 0.3 Å/sec/kW, and it was at a level where practical application would be difficult. A sputtered film of 500 Å was formed on the glass substrate. The film composition was Ti: 30.7 at %, Ag: 3.1 at %, O: 66.2 at %, O/Ti: 2.16, and O/(2Ti+0.5Ag): 1.05. The refractive index and extinction coefficient of the sputtered film were measured. The refractive index and extinction coefficient were measured with an ellipsometer using a light wavelength of 405 nm. These results are also shown in Table 2. Consequently, the refractive index decreased to 2.59 and the extinction coefficient was 0.005.

Example 7

As the raw materials, titanium oxide ($TiO_2$) having an average grain size of 10 μm and a purity of 4N (99.99%) and silver powder having an average grain size of 10 μm and a purity of 3N (99.9%) were used. These raw materials were blended to achieve $TiO_2$:Ag=99:1 (at %) and mixed. 1 kg of the mixed powder was mixed with a dry blender so that the silver is uniformly dispersed in the titanium oxide powder. Subsequently, the mixed powder was filled in a carbon die and subject to hot press. The hot press conditions were 920° C. and bearing surface pressure of 350 kgf/cm². The obtained sintered compact was machined to prepare a target of φ152 mm and 5 mmt. Consequently, a target having a density of 98% and a specific resistance of 7 Ωcm was obtained. The grain size of the Ag phase in the target was 15 μm. No abnormal discharge occurred during the sputtering. The results are also shown in Table 1.

Subsequently, the sputtering target produced as described above was used to form a sputtered film on a glass substrate. As the sputtering conditions, DC sputtering was performed in an Ar gas atmosphere with a gas pressure of 0.5 Pa, a gas flow rate of 50 sccm, and a sputtering power of 500 to 1000 w. It was possible to perform DC sputtering without any problem, and it was confirmed that the target has conductivity. The deposition rate improved considerably at 1.8 Å/sec/kW. Accordingly, it is evident that the deposition rate can be improved considerably by performing DC sputtering to the target in the Ar gas atmosphere. A sputtered film of 500 Å was formed on the glass substrate. The film composition was Ti: 33.1 at %, Ag: 0.7 at %, O: 66.2 at %, O/Ti: 2.00, and O/(2Ti+0.5Ag): 0.99. The refractive index and extinction coefficient of the sputtered film were measured. The refractive index and extinction coefficient were measured with an ellipsometer using a light wavelength of 405 nm. These results are also shown in Table 2. Consequently, the refractive index increased to 2.67, and the extinction coefficient was 0.02. Thus, it was possible to form a favorable interference film or protective film for an optical recording medium.

Example 8

As the raw materials, titanium oxide ($TiO_2$) having an average grain size of 10 μm and a purity of 4N (99.99%) and silver powder having an average grain size of 10 μm and a purity of 3N (99.9%) were used. These raw materials were blended to achieve $TiO_2$:Ag=99.5:0.5 (at %) and mixed. 1 kg of the mixed powder was mixed with a dry blender so that the silver is uniformly dispersed in the titanium oxide powder. Subsequently, the mixed powder was filled in a carbon die and subject to hot press. The hot press conditions were 920° C. and bearing surface pressure of 350 kgf/cm². The obtained sintered compact was machined to prepare a target of φ152 mm and 5 mmt. Consequently, a target having a density of 98% and a specific resistance of 9 Ωcm was obtained. The grain size of the Ag phase in the target was 10 μm. No abnormal discharge occurred during the sputtering. The results are also shown in Table 1.

Subsequently, the sputtering target produced as described above was used to form a sputtered film on a glass substrate. As the sputtering conditions, DC sputtering was performed in an Ar gas atmosphere with a gas pressure of 0.5 Pa, a gas flow rate of 50 sccm, and a sputtering power of 500 to 1000 w. It was possible to perform DC sputtering without any problem, and it was confirmed that the target has conductivity. As with Example 7, the deposition rate improved considerably at 1.8 Å/sec/kW. Accordingly, it is evident that the deposition rate can be improved considerably by performing DC sputtering to the target in the Ar gas atmosphere. A sputtered film of 500 Å was formed on the glass substrate. The film composition was Ti: 33.3 at %, Ag: 0.2 at %, O: 66.5 at %, O/Ti: 2.00, and O/(2Ti+0.5Ag): 1.00. The refractive index and extinction coefficient of the sputtered film were measured. The refractive index and extinction coefficient were measured with an ellipsometer using a light wavelength of 405 nm. These results are also shown in Table 2. Consequently, the refractive index increased to 2.66, and the extinction coefficient was 0.01. Thus, it was possible to form a favorable interference film or protective film for an optical recording medium.

Example 9

As the raw materials, titanium oxide ($TiO_2$) having an average grain size of 1 μm and a purity of 4N (99.99%) and silver powder having an average grain size of 1.5 μm and a purity of 3N (99.9%) were used. These raw materials were blended to achieve $TiO_2$:Ag=99.95:0.05 (at %) and mixed. 1 kg of the mixed powder was mixed with a dry blender so that the silver is uniformly dispersed in the titanium oxide powder. Subsequently, the mixed powder was filled in a carbon die and subject to hot press. The hot press conditions were 920° C. and bearing surface pressure of 350 kgf/cm². The obtained sintered compact was machined to prepare a target of φ152 mm and 5 mmt. Consequently, a target having a density of 98% and a specific resistance of 10 Ωcm was obtained. The grain size of the Ag phase in the target was 1.5 μm. No abnormal discharge occurred during the sputtering. The results are also shown in Table 1.

Subsequently, the sputtering target produced as described above was used to form a sputtered film on a glass substrate. As the sputtering conditions, DC sputtering was performed in an Ar gas atmosphere with a gas pressure of 0.5 Pa, a gas flow rate of 50 sccm, and a sputtering power of 500 to 1000 w. It was possible to perform DC sputtering without any problem, and it was confirmed that the target has conductivity. The deposition rate improved at 1.6 Å/sec/kW. Accordingly, it is evident that the deposition rate can be improved considerably by performing DC sputtering to the target in the Ar gas atmosphere. A sputtered film of 500 Å was formed on the glass substrate. The film composition was Ti: 33.3 at %, Ag: 0.02 at %, O: 66.68 at %, O/Ti: 2:00, and O/(2Ti+0.5Ag): 1.00. The refractive index and extinction coefficient of the sputtered film were measured. The refractive index and extinction coefficient were measured with an ellipsometer using a light wavelength of 405 nm. These results are also shown in Table 2. Consequently, the refractive index increased to 2.62 and the extinction coefficient was 0.007. Thus, it was possible to form a favorable interference film or protective film for an optical recording medium.

Example 10

As the raw materials, titanium oxide ($TiO_2$) having an average grain size of 1 μm and a purity of 4N (99.99%) and silver powder having an average grain size of 1.5 μm and a purity of 3N (99.9%) were used. These raw materials were blended to achieve $TiO_2$:Ag=99.99:0.01 (at %) and mixed. 1 kg of the mixed powder was mixed with a dry blender so that the silver is uniformly dispersed in the titanium oxide powder. Subsequently, the mixed powder was filled in a carbon die and subject to hot press. The hot press conditions were 920° C. and bearing surface pressure of 350 kgf/cm². The obtained sintered compact was machined to prepare a target of φ152 mm and 5 mmt. Consequently, a target having a density of 98% and a specific resistance of 10 Ωcm was obtained. The grain size of the Ag phase in the target was 1.5 μm. No abnormal discharge occurred during the sputtering. The results are also shown in Table 1.

Subsequently, the sputtering target produced as described above was used to form a sputtered film on a glass substrate. As the sputtering conditions, DC sputtering was performed in an Ar gas atmosphere with a gas pressure of 0.5 Pa, a gas flow rate of 50 sccm, and a sputtering power of 500 to 1000 w. It was possible to perform DC sputtering without any problem, and it was confirmed that the target has conductivity. The deposition rate improved at 1.6 Å/sec/kW. Accordingly, it is evident that the deposition rate can be improved considerably by performing DC sputtering to the target in the Ar gas atmosphere. A sputtered film of 500 Å was formed on the glass substrate. The film composition was Ti: 33.3 at %, Ag: 0.005 at %, O: 66.695 at %, O/Ti: 2.00, and O/(2Ti+0.5Ag): 1.00. The refractive index and extinction coefficient of the sputtered film were measured. The refractive index and extinction coefficient were measured with an ellipsometer using a light wavelength of 405 nm. These results are also shown in Table 2. Consequently, the refractive index increased to 2.61 and the extinction coefficient was 0.005. Thus, it was possible to form a favorable interference film or protective film for an optical recording medium.

Example 11

As the raw materials, titanium oxide ($TiO_2$) having an average grain size of 1 μm and a purity of 4N (99.99%), titanium powder having an average grain size of 15 μm and a purity of 3N, and silver powder having an average grain size of 1.5 µm and a purity of 3N (99.9%) were used. These raw materials were blended to achieve $TiO_{1.9}$:Ag=99.95: 0.05 (at %) and mixed. 1 kg of the mixed powder was mixed with a dry blender so that the silver is uniformly dispersed in the titanium oxide powder. Subsequently, the mixed powder was filled in a carbon die and subject to hot press. The hot press conditions were 920° C. and bearing surface pressure of 350 kgf/cm². The obtained sintered compact was machined to prepare a target of φ152 mm and 5 mmt. Consequently, a target having a density of 98% and a specific resistance of 0.01 Ωcm was obtained. The grain size of the Ag phase in the target was 1.5 µm. No abnormal discharge occurred during the sputtering. The results are also shown in Table 1.

Subsequently, the sputtering target produced as described above was used to form a sputtered film on a glass substrate. As the sputtering conditions, DC sputtering was performed in an Ar-4% O2 gas atmosphere with a gas pressure of 0.5 Pa, a gas flow rate of 50 sccm, and a sputtering power of 500 to 1000 w. It was possible to perform DC sputtering without any problem, and it was confirmed that the target has conductivity. The deposition rate was 0.7 Å/sec/kW. A sputtered film of 500 Å was formed on the glass substrate. The film composition was Ti: 33.4 at %, Ag: 0.02 at %, O: 66.58 at %, O/Ti: 1.99, and O/(2Ti+0.5Ag): 1.00. The refractive index and extinction coefficient of the sputtered film were measured. The refractive index and extinction coefficient were measured with an ellipsometer using a light wavelength of 405 nm. These results are also shown in Table 2. Consequently, the refractive index increased to 2.61 and the extinction coefficient was 0.007. Thus, it was possible to form a favorable interference film or protective film for an optical recording medium.

Example 12

As the raw materials, titanium oxide ($TiO_2$) having an average grain size of 1 µm and a purity of 4N (99.99%), titanium powder having an average grain size of 15 µm and a purity of 3N, and silver powder having an average grain size of 1.5 µm and a purity of 3N (99.9%) were used. These raw materials were blended to achieve $TiO_{1.5}$:Ag=99.99: 0.01 (at %) and mixed. 1 kg of the mixed powder was mixed with a dry blender so that the silver is uniformly dispersed in the titanium oxide powder. Subsequently, the mixed powder was filled in a carbon die and subject to hot press. The hot press conditions were 920° C. and bearing surface pressure of 350 kgf/cm². The obtained sintered compact was machined to prepare a target of φ152 mm and 5 mmt. Consequently, a target having a density of 98% and a specific resistance of 0.008 Ωcm was obtained. The grain size of the Ag phase in the target was 1.5 µm. No abnormal discharge occurred during the sputtering. The results are also shown in Table 1.

Subsequently, the sputtering target produced as described above was used to form a sputtered film on a glass substrate. As the sputtering conditions, DC sputtering was performed in an Ar-4% O2 gas atmosphere with a gas pressure of 0.5 Pa, a gas flow rate of 50 sccm, and a sputtering power of 500 to 1000 w. It was possible to perform DC sputtering without any problem, and it was confirmed that the target has conductivity. The deposition rate was 0.6 Å/sec/kW. A sputtered film of 500 Å was formed on the glass substrate. The film composition was Ti: 33.4 at %, Ag: 0.006 at %, O: 66.594 at %, O/Ti: 1.99, and O/(2Ti+0.5Ag): 1.00. The refractive index and extinction coefficient of the sputtered film were measured. The refractive index and extinction coefficient were measured with an ellipsometer using a light wavelength of 405 nm. These results are also shown in Table 2. Consequently, the refractive index increased to 2.60 and the extinction coefficient was 0.01. Thus, it was possible to form a favorable interference film or protective film for an optical recording medium.

Example 13

As the raw materials, titanium oxide ($TiO_2$) having an average grain size of 1 µm and a purity of 4N (99.99%), titanium powder having an average grain size of 15 µm and a purity of 3N, and silver powder having an average grain size of 5 µm and a purity of 3N (99.9%) were used. These raw materials were blended to achieve $TiO_{1.95}$:Ag=99.9:0.1 (at %) and mixed. 1 kg of the mixed powder was mixed with a dry blender so that the silver is uniformly dispersed in the titanium oxide powder. Subsequently, the mixed powder was filled in a carbon die and subject to hot press. The hot press conditions were 920° C. and bearing surface pressure of 350 kgf/cm². The obtained sintered compact was machined to prepare a target of φ152 mm and 5 mmt. Consequently, a target having a density of 98% and a specific resistance of 0.08 Ωcm was obtained. The grain size of the Ag phase in the target was 5 µm. No abnormal discharge occurred during the sputtering. The results are also shown in Table 1.

Subsequently, the sputtering target produced as described above was used to form a sputtered film on a glass substrate. As the sputtering conditions, DC sputtering was performed in an Ar gas atmosphere with a gas pressure of 0.5 Pa, a gas flow rate of 50 sccm, and a sputtering power of 500 to 1000 w. It was possible to perform DC sputtering without any problem, and it was confirmed that the target has conductivity. The deposition rate improved to 1.6 Å/sec/kW. Accordingly, it is evident that the deposition rate can be improved considerably by performing DC sputtering to the target in the Ar gas atmosphere. A sputtered film of 500 Å was formed on the glass substrate. The film composition was Ti: 33.8 at %, Ag: 0.04 at %, O: 66.16 at %, O/Ti: 1.96, and O/(2Ti+0.5Ag): 0.98. The refractive index and extinction coefficient of the sputtered film were measured. The refractive index and extinction coefficient were measured with an ellipsometer using a light wavelength of 405 nm. These results are also shown in Table 2. Consequently, the refractive index increased to 2.63 and the extinction coefficient was 0.09. Thus, it was possible to form a favorable interference film or protective film for an optical recording medium.

Comparative Example 6

In this Comparative Example, the target obtained in Example 11 was subject to sputtering in an oxygen-free Ar atmosphere. Although it was possible to perform DC sputtering itself, problems arose in the properties of the thin film. Specifically, the refractive index of the obtained film decreased to 2.58, and the extinction coefficient increased to 0.21. Accordingly, even if the target itself is free from problems, when it is subject to sputtering in an oxygen-free Ar atmosphere, it is not possible to obtain a favorable thin film. As for Comparative Example 6, the results of the target are shown in Table 1, and the composition and results of the thin film are shown in Table 2. As shown in the Tables, the film composition was Ti: 34.3 at %, Ag: 0.02 at %, O: 65.68 at %, O/Ti: 1.91, and O/(2Ti+0.5Ag): 0.96.

Moreover, although several other tests were conducted, it was discovered that, in cases where the Ti content exceeds 34.0%, problems arise from decrease in the refractive index and increase in the extinction coefficient if sputtering is not performed in an argon gas atmosphere containing 0.1 to 16% of oxygen. Accordingly, when using the sintered sputtering target of the present invention, particularly when the Ti content is 34.0% or more, it is preferable to perform sputtering in an argon gas atmosphere containing 0.1 to 16% of oxygen.

Comparative Example 7

In this Comparative Example, the target obtained in Example 12 was subject to sputtering in an oxygen-free Ar atmosphere. Although it was possible to perform DC sputtering itself, problems arose in the properties of the thin film. Specifically, the refractive index of the obtained film decreased to 2.54, and the extinction coefficient increased to 0.34. Accordingly, even if the target itself is free from problems, when it is subject to sputtering in an oxygen-free Ar atmosphere, it is not possible to obtain a favorable thin film. As for Comparative Example 7, the results of the target are shown in Table 1, and the composition and results of the thin film are shown in Table 2. As shown in the Tables, the film composition was Ti: 39.9 at %, Ag: 0.006 at %, O: 60.094 at %, O/Ti: 1.51, and O/(2Ti+0.5Ag): 0.75.

Moreover, although several other tests were conducted, it was discovered that, in cases where the Ti content exceeds 34.0%, problems arise from decrease in the refractive index and increase in the extinction coefficient if sputtering is not performed in an argon gas atmosphere containing 0.1 to 16% of oxygen. Accordingly, when using the sintered sputtering target of the present invention, particularly when the Ti content is 34.0% or more, it is preferable to perform sputtering in an argon gas atmosphere containing 0.1 to 16% of oxygen.

Summary of Examples and Comparative Examples

The foregoing Examples and Comparative Examples illustrated representative examples. Although not shown in the foregoing Examples, in cases where the composition of the thin film was 29.6 at % or more and 34.0 at % or less of Ti, 0.003 at % or more and 7.4 at % or less of Ag, and oxygen as the remainder thereof, and O/(2Ti+0.5Ag) as a ratio of oxygen to metals is 0.97 or more, and further where O/Ti as a ratio of oxygen to Ti is 2 or more; all cases resulted in a high refractive index and a low extinction coefficient as with foregoing Example 1 to Example 7. Moreover, when the sputtering target contained the respective components at a composition ratio of $(TiO_{2-m})_{1-n}Ag_n$ (provided $0 \leq m \leq 0.5$, and $0.0001 \leq n \leq 0.2$), and contained Ag particles having an average grain size of 15 μm or less; the specific resistance was 10 Ωcm or less, and favorable results were achieved in which no abnormal discharge was observed.

The present invention provides a thin film mainly comprising titanium oxide having a high refractive index and a low extinction coefficient, a sintered sputtering target mainly comprising titanium oxide suitable for producing the thin film, and a method of producing a thin film mainly comprising titanium oxide. The thin film obtained by the present invention can be used as films and layers for an optical information recording medium of electronic parts such as CDs and DVDs. In addition, the thin film of the present invention is particularly useful as an interference film or a protective film for an optical information recording medium having superior transmittance and with minimal deterioration in reflectance. Since a protective layer of high-melting dielectrics must be durable against repeated thermal stress caused by the heating and cooling, and must not allow such thermal effect to influence the reflective film or other areas, and since it is also required to be thin and have low reflectivity and strength to prevent alteration; the present invention is useful as such dielectric protective layer. In addition, a material having the foregoing properties can also be applied to architectural glass, automotive glass, CRTs and flat-panel displays; that is, such material can also be used as a heat reflective film, an antireflective film, and an interference filter.

We claim:

1. A sputtering target for producing a thin film, comprising:
a sintered structure containing Ti, Ag and O as its constituent elements and having a composition of $(TiO_{2-m})_{1-n}Ag_n$, where m and n satisfy the equations $0 \leq m \leq 0.5$ and $0.0001 \leq n \leq 0.1$;
said sintered structure having a specific resistance of 10 Ωcm or less; and
said sintered structure having a matrix phase of titanium oxide and an Ag phase dispersed as particles within said matrix phase;
wherein an average grain size of said Ag phase particles existing in said sintered structure is 15 μm or less.

2. The sputtering target according to claim 1, wherein the average grain size of said Ag phase particles existing in said sintered structure is 1.5 μm or more and 15 μm or less.

3. The sputtering target according to claim 1, wherein the sputtering target is adapted to produce an interference or protective thin film for an optical information recording medium.

4. A sputtering target for producing a thin film, comprising:
a sintered structure containing Ti, Ag and O as its constituent elements and having a composition of $(TiO_{2-m})_{1-n} Ag_n$, where m and n satisfy the equations $0 \leq m \leq 0.5$ and $0.01 \leq n \leq 0.1$;
said sintered structure having a specific resistance of 10 Ωcm or less; and
said sintered structure having a matrix phase of titanium oxide and an Ag phase dispersed as particles within said matrix phase;
wherein an average grain size of said Ag phase particles existing in said sintered structure is 15 μm or less.

5. The sputtering target according to claim 4, wherein the average grain size of said Ag phase particles existing in said sintered structure is 1.5 μm or more and 15 μm or less.

6. The sputtering target according to claim 4, wherein the sputtering target is adapted to produce an interference or protective thin film for an optical information recording medium.

* * * * *